United States Patent [19]
Yang et al.

[11] Patent Number: 6,096,647
[45] Date of Patent: Aug. 1, 2000

[54] METHOD TO FORM $COSI_2$ ON SHALLOW JUNCTION BY SI IMPLANTATION

[75] Inventors: Hong Yang, Dallas, Tex.; Xing Yu, Singapore, Singapore; Ying Keung Leung, Aberdeen, The Hong Kong Special Administrative Region of the People's Republic of China

[73] Assignee: Chartered Semiconductor Manufacturing Ltd., Singapore, Singapore

[21] Appl. No.: 09/425,311

[22] Filed: Oct. 25, 1999

[51] Int. Cl.[7] .................................... H01L 21/44
[52] U.S. Cl. ........................... 438/682; 438/683
[58] Field of Search ..................... 438/682, 683

[56] References Cited

U.S. PATENT DOCUMENTS

| | | |
|---|---|---|
| 5,217,923 | 6/1993 | Suguro . |
| 5,510,295 | 4/1996 | Cabral, Jr. et al. ............... 437/200 |
| 5,536,676 | 7/1996 | Cheng et al. ...................... 437/162 |
| 5,541,131 | 7/1996 | Yoo et al. . |
| 5,710,438 | 1/1998 | Oda et al. ........................... 257/69 |
| 5,780,361 | 7/1998 | Inoue ................................. 438/683 |
| 5,824,600 | 10/1998 | Byun et al. ........................ 438/682 |
| 5,874,342 | 2/1999 | Tsai et al. ......................... 438/301 |
| 5,960,319 | 9/1999 | Iwata et al. . |

FOREIGN PATENT DOCUMENTS

| | | |
|---|---|---|
| 01179415 | 1/1988 | Japan . |
| 05029343 | 7/1991 | Japan . |
| 09050973 | 8/1995 | Japan . |
| 10242081 | 8/1997 | Japan . |

*Primary Examiner*—Richard Booth
*Assistant Examiner*—Ron Pompey
*Attorney, Agent, or Firm*—George O. Saile; Rosemary L.S. Pike

[57] ABSTRACT

A new method for forming a cobalt disilicide film on shallow junctions with reduced silicon consumption in the fabrication of an integrated circuit is described. A semiconductor substrate is provided having silicon regions to be silicided. A cobalt layer is deposited overlying the semiconductor substrate and subjected to a first rapid thermal process whereby the cobalt is transformed to cobalt monosilicide where it overlies the silicon regions and wherein the cobalt not overlying the silicon regions is unreacted. The unreacted cobalt layer is removed. A dielectric layer is deposited overlying the substrate and the cobalt monosilicide layer. Silicon ions are implanted through the dielectric layer into the cobalt monosilicide layer. The substrate is subjected to a second rapid thermal process whereby the cobalt monosilicide is transformed to cobalt disilicide wherein the silicon ions implanted into the cobalt monosilicide layer act as a main (not sole) silicon source for the transformation to complete formation of a cobalt disilicide film in the manufacture of an integrated circuit.

25 Claims, 4 Drawing Sheets

METHOD TO FORM COSI₂ ON SHALLOW JUNCTION BY SI IMPLANTATION

BACKGROUND OF THE INVENTION

1. Field of the Invention

The invention relates to the fabrication of integrated circuit devices, and more particularly, to a method of reducing silicon consumption in the formation of cobalt silicide in the fabrication of integrated circuits.

2. Description of the Prior Art

Cobalt disilicide ($CoSi_2$) is a preferred salicide technology as CMOS device sizes shrink to 0.18 µm and beyond because of its good performance with small polysilicon and active area line widths. However, $CoSi_2$ is known to consume more Si than does $TiSi_2$. This is a drawback for shallow junctions used in future technologies. It is desired to find a process which will form $CoSi_2$ without increased Si consumption.

U.S. Pat. No. 5,710,438 to Oda et al teaches an ion implant into cobalt before annealing to remove the native oxide film underlying the cobalt layer. U.S. Pat. No. 5,874,342 to Tsai et al teaches using a metal capping layer over cobalt and forming $CoSi_2$ using two annealing steps. Ions are implanted into the $CoSi_2$ which is heated again to diffuse the ions into the substrate to form S/D regions. U.S. Pat. No. 5,536,676 to Cheng et al implants ions into polysilicon, then deposits cobalt thereover. The substrate is annealed to form both CoSi and junctions under the polysilicon by diffusion of the implanted ions. U.S. Pat. Nos. 5,824,600 to Byun et al, 5,780,361 to Inoue, and 5,510,295 to Cabral, Jr. et al show various methods of cobalt silicide formation.

SUMMARY OF THE INVENTION

A principal object of the present invention is to provide an effective and very manufacturable method of fabricating a cobalt disilicide film in the fabrication of an integrated circuit.

A further object of the invention is to provide a method of fabricating cobalt disilicide with reduced silicon consumption in the fabrication of an integrated circuit.

Yet another object is to provide a method of forming a cobalt disilicide film on shallow junctions.

Yet another object is to provide a method of forming a cobalt disilicide film on shallow junctions with reduced silicon consumption.

Yet another object of the invention is to forming a cobalt disilicide film on shallow junctions with reduced silicon consumption by implanting silicon ions.

In accordance with the objects of the invention a method for forming a cobalt disilicide film on shallow junctions with reduced silicon consumption in the fabrication of an integrated circuit is achieved. A semiconductor substrate is provided having silicon regions to be silicided. A cobalt layer is deposited overlying the semiconductor substrate and subjected to a first rapid thermal process whereby the cobalt is transformed to cobalt monosilicide where it overlies the silicon regions and wherein the cobalt not overlying the silicon regions is unreacted. The unreacted cobalt layer is removed. A dielectric layer is deposited overlying the substrate and the cobalt monosilicide layer. Silicon ions are implanted through the dielectric layer into the cobalt monosilicide layer. The substrate is subjected to a second rapid thermal process whereby the cobalt monosilicide is transformed to cobalt disilicide wherein the silicon ions implanted into the cobalt monosilicide layer act as a main (not sole) silicon source for the transformation to complete formation of a cobalt disilicide film in the manufacture of an integrated circuit.

BRIEF DESCRIPTION OF THE DRAWINGS

In the accompanying drawings forming a material part of this description, there is shown.

DESCRIPTION OF THE PREFERRED EMBODIMENTS

The process of the present invention can be used in any application in which it is desired to form a cobalt disilicide film overlying a silicon region. The process of the invention will be described for the application in which $CoSi_2$ is formed overlying a gate electrode and source and drain regions. It is to be understood that the invention is not limited to the application so illustrated.

Figure 1:
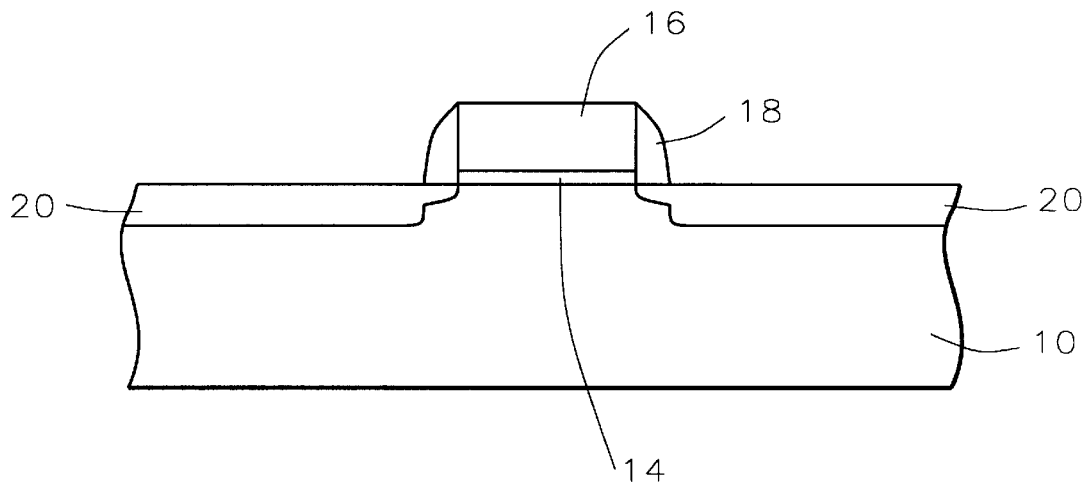
FIGS. 1 through 7 schematically illustrate in cross-sectional representation a preferred embodiment of the present invention.

Referring now more particularly to FIG. 1, there is shown an illustration of a portion of a partially completed integrated circuit. The semiconductor substrate 10 is preferably composed of silicon having a (100) crystallographic orientation. Gate electrodes 16 and source and drain regions 20 are formed in and on the semiconductor substrate as is conventional in the art. For example, gate electrode 16 has been formed overlying a gate oxide layer 14. Sidewall spacers, such as silicon oxide, 18 are formed on the gate. Source and drain regions are n-type or p-type, depending on the type of device to be fabricated.

Figure 2:
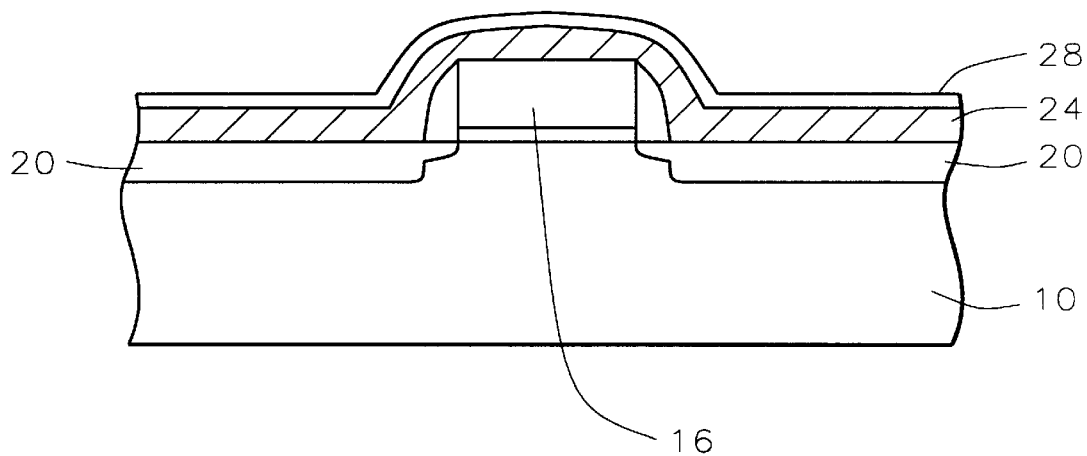

The wafer is subjected to a pre-metal clean, such as a wet clean using hydrofluoric acid (HF), for example. Next, as shown in FIG. 2, a layer of cobalt 24 is sputter deposited over the surface of the substrate and overlying the gate electrode. The cobalt layer has a thickness of between about 50 and 200 Angstroms. Next, a capping metal layer, such as titanium nitride or titanium is deposited over the cobalt layer to a thickness of between about 100 and 300 Angstroms. The metal capping layer is optional, but preferred. The metal capping layer is used to prevent cobalt oxidation during rapid thermal anneal (RTA), There are other ways to avoid cobalt oxidation, such as high temperature (450° C.) cobalt deposition and/or in-situ anneal. But, the metal cap process is more manufacturable.

Figure 3:
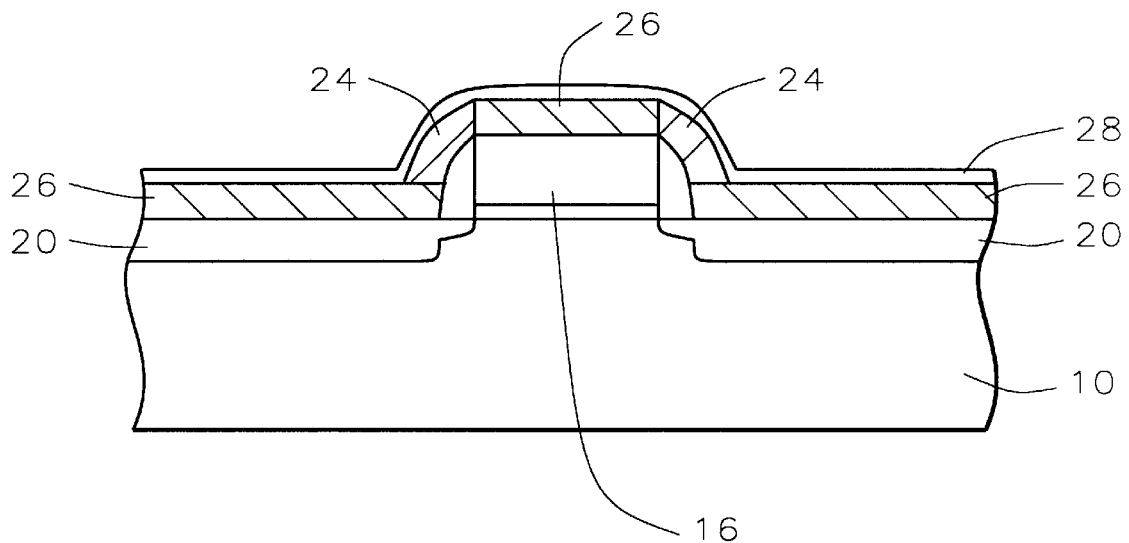

Now, the wafer is subjected to a first rapid thermal process (RTP) at a low temperature of between about 500 and 600° C. and preferably of about 550° C. for 20 to 60 seconds. This annealing will form cobalt monosilicide (CoSi) 26 over the gate electrode and over the source and drain regions, as shown in FIG. 3. This low temperature annealing to form CoSi first consumes only 57% of the silicon consumed by an annealing which would form $CoSi_2$. For example, 1 Angstrom of cobalt is transformed to 2.02 Angstroms of CoSi versus 3.52 Angstroms of $CoSi_2$.

Figure 4:
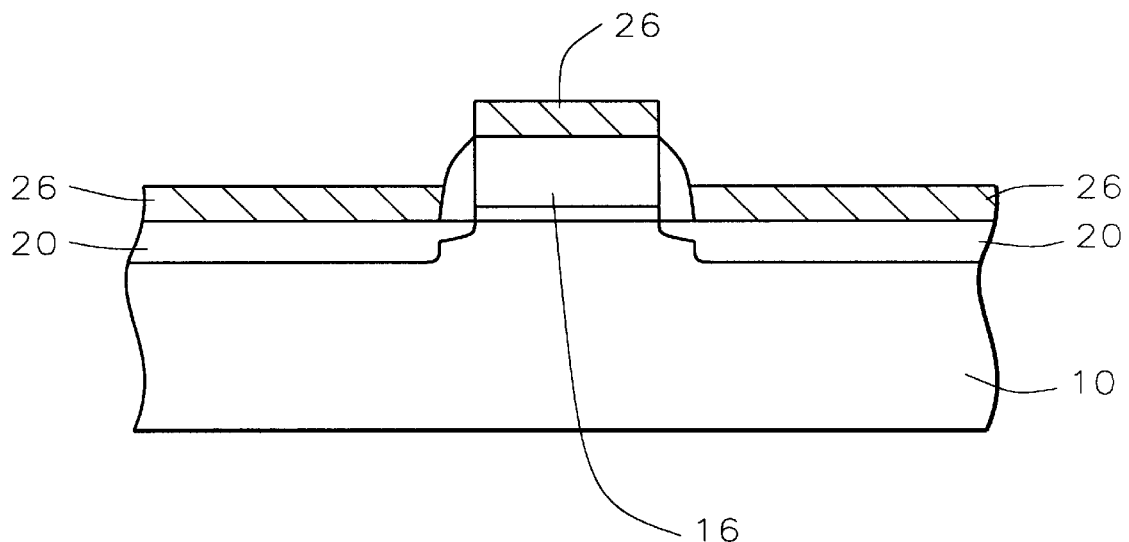

Referring now to FIG. 4, the metal capping layer 28 and the unreacted cobalt layer 24 are stripped from the wafer surface, leaving the CoSi film 26 over the gate electrode 16 and the source and drain regions 20.

Figure 5:
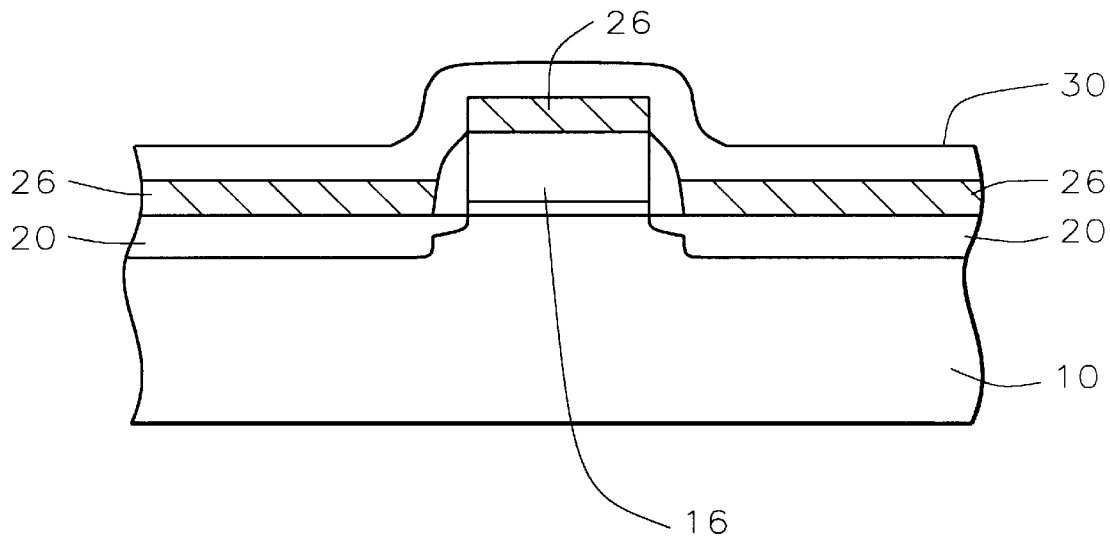

A dielectric capping film 30 is deposited over the wafer surface, as shown in FIG. 5, to a thickness of between about 500 and 1000 Angstroms. This capping film 30 may comprise an oxide, nitride, or oxynitride, for example.

Figure 6:
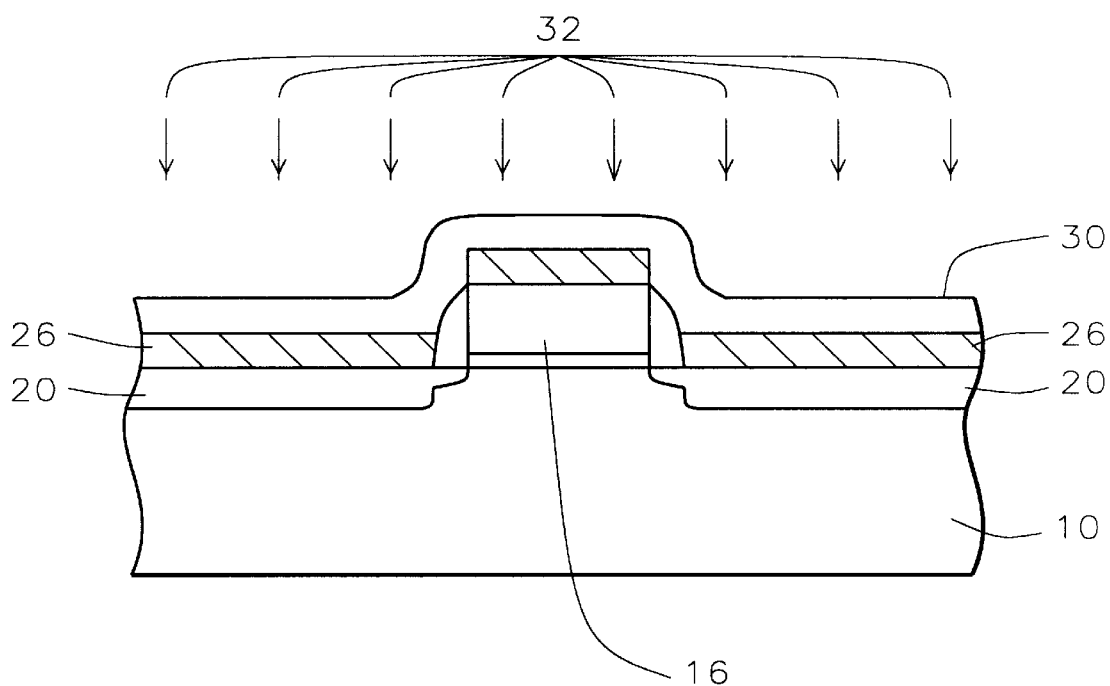

Next, silicon ions are implanted into the CoSi layer through the capping dielectric film 30, as shown by 32 in FIG. 6. The implantation is at a high dose of between about $1\times10^{16}$ to $1\times10^{17}$ atoms/cm$^2$ and at a energy of between about 10 to 50 KeV. The capping dielectric film serves as a barrier to reduce implant channeling. The thickness of the capping dielectric film can be varied so that the ions will be centered vertically within the CoSi film.

Figure 7:
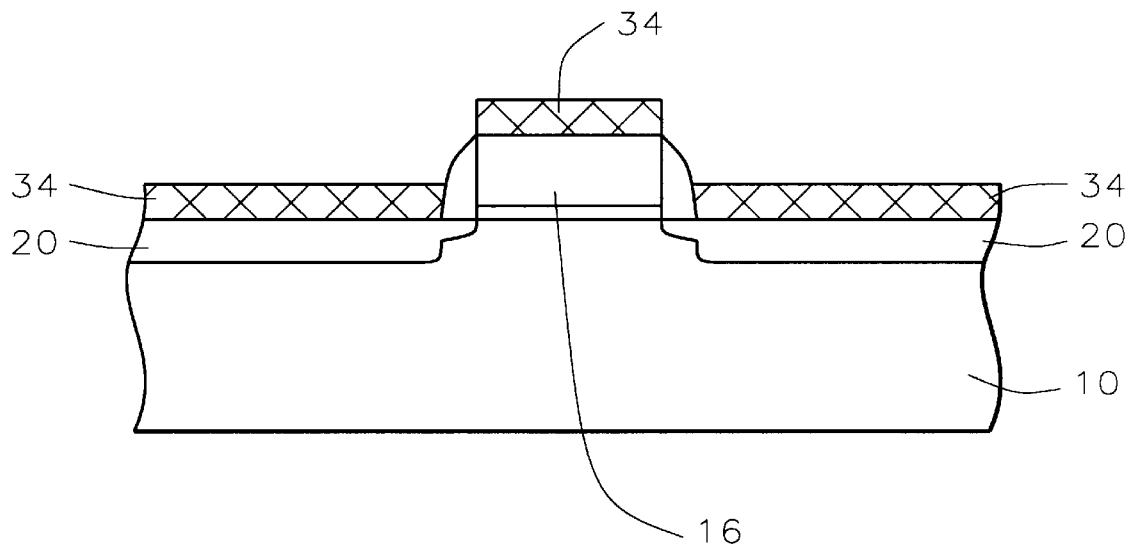

Now, the wafer is subjected to a second RTP, this time at a temperature of between about 750 and 900° C., to transform the cobalt monosilicide (CoSi) to cobalt disilicide (CoSi$_2$) 34, as shown in FIG. 7. The implanted silicon will be the main silicon source for the conversion of CoSi to CoSi$_2$. Therefore, there will be no or minimal further consumption of silicon from the gate and source and drain regions. This is especially important where there are shallow source/drain junctions.

Figure 8:
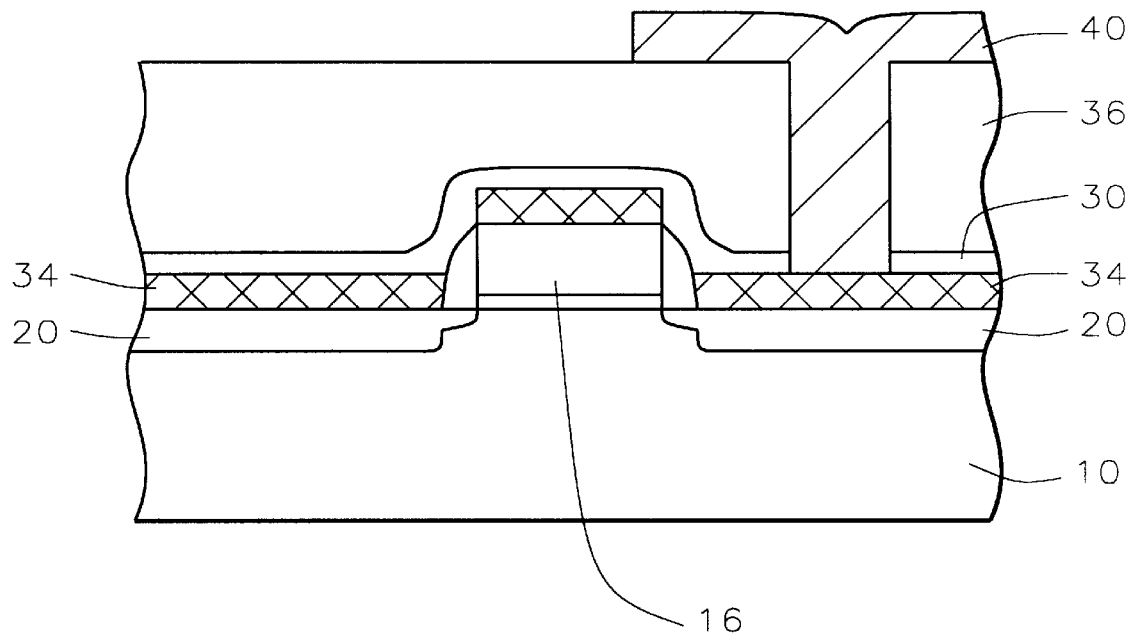
FIG. 8 schematically illustrates in cross-sectional representation a completed integrated circuit manufactured according to the process of the present invention.

Standard backend processing continues as is conventional to complete the integrated circuit. The dielectric capping layer 30 may be removed after the silicon implantation or may remain over the silicide layer as part of the interlayer dielectric. For example, FIG. 8 shows the capping dielectric 30 covered by an additional thick dielectric layer 36. Electrical connections may be made, for example, to one of the silicided source/drain regions 20 by metal contact 40, as shown.

The process of the invention provides an effective method of forming CoSi$_2$ for shallow junctions and small feature sizes by reducing silicon consumption. Forming first CoSi reduces silicon consumption. Then, silicon ions are implanted through a capping dielectric layer to provide a silicon source for the second annealing step to convert CoSi to CoSi$_2$.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a cobalt disilicide film in the manufacture of an integrated circuit comprising:

providing a semiconductor substrate having silicon regions to be silicided;

depositing a cobalt layer overlying said semiconductor substrate;

subjecting said substrate to a first rapid thermal process whereby said cobalt is transformed to cobalt monosilicide where it overlies said silicon regions and wherein said cobalt not overlying said silicon regions is unreacted;

removing said unreacted cobalt layer;

depositing a dielectric layer overlying said substrate and said cobalt monosilicide layer;

implanting silicon ions through said dielectric layer into said cobalt monosilicide layer; and thereafter subjecting said substrate to a second rapid thermal process whereby said cobalt monosilicide is transformed to cobalt disilicide wherein said silicon ions implanted into said cobalt monosilicide layer act as a silicon source for said transformation to complete formation of said cobalt disilicide film in the manufacture of said integrated circuit.

2. The method according to claim 1 wherein said silicon regions to be silicided comprise gate electrodes and associated source and drain regions.

3. The method according to claim 1 wherein said cobalt layer is sputter deposited to a thickness of between about 50 and 200 Angstroms.

4. The method according to claim 1 further comprising depositing a capping metal layer overlying said cobalt layer.

5. The method according to claim 4 wherein said capping metal layer comprises one of the group containing titanium and titanium nitride having a thickness of between about 100 and 300 Angstroms.

6. The method according to claim 1 wherein said first rapid thermal process is performed at a temperature of between about 500 and 600° C.

7. The method according to claim 4 wherein said capping metal layer is removed during said step of removing said unreacted cobalt layer.

8. The method according to claim 1 wherein said dielectric layer comprises one of the group containing silicon oxide, silicon nitride, and silicon oxynitride and wherein said dielectric layer has a thickness of between about 500 and 1000 Angstroms.

9. The method according to claim 1 wherein said silicon ions are implanted at a dosage of between about $1\times10^{16}$ and $1\times10^{17}$ atoms/cm$^2$.

10. The method according to claim 1 wherein said second rapid thermal process is performed at a temperature of between about 750 and 900° C.

11. A method of fabricating a cobalt disilicide film in the manufacture of an integrated circuit comprising:

providing a semiconductor substrate having silicon regions to be silicided;

depositing a cobalt layer overlying said semiconductor substrate;

subjecting said substrate to a first rapid thermal process at a low temperature of less than 600° C. whereby said cobalt is transformed to cobalt monosilicide where it overlies said silicon regions and wherein said cobalt not overlying said silicon regions is unreacted;

removing said unreacted cobalt layer;

depositing a dielectric layer overlying said substrate and said cobalt monosilicide layer;

implanting silicon ions through said dielectric layer into said cobalt monosilicide layer;

thereafter subjecting said substrate to a second rapid thermal process whereby said cobalt monosilicide is transformed to cobalt disilicide wherein said silicon ions implanted into said cobalt monosilicide layer act as a silicon source for said transformation to complete formation of said cobalt disilicide film in the manufacture of said integrated circuit.

12. The method according to claim 11 wherein said silicon regions to be silicided comprise gate electrodes and associated source and drain regions.

13. The method according to claim 11 wherein said cobalt layer is sputter deposited to a thickness of between about 50 and 200 Angstroms.

14. The method according to claim 11 further comprising depositing a capping metal layer overlying said cobalt layer.

15. The method according to claim 14 wherein said capping metal layer comprises one of the group containing titanium and titanium nitride having a thickness of between about 100 and 300 Angstroms.

16. The method according to claim 14 wherein said capping metal layer is removed during said step of removing said unreacted cobalt layer.

17. The method according to claim 11 wherein said dielectric layer comprises one of the group containing silicon oxide, silicon nitride, and silicon oxynitride and wherein said dielectric layer has a thickness of between about 500 and 1000 Angstroms.

18. The method according to claim 11 wherein said silicon ions are implanted at a dosage of between about $1 \times 10^{16}$ and $1 \times 10^{17}$ atoms/cm$^2$.

19. The method according to claim 11 wherein said second rapid thermal process is performed at a temperature of between about 750 and 900° C.

20. A method of fabricating a cobalt disilicide film in the manufacture of an integrated circuit comprising:

providing a gate electrodes and associated source and drain regions in and on a semiconductor substrate wherein said gate electrodes have dielectric spacers on their sidewalls;

depositing a cobalt layer overlying said gate electrodes and associated source and drain regions;

depositing a capping metal layer overlying said cobalt layer;

subjecting said substrate to a first rapid thermal process at a low temperature of less than 600° C. whereby said cobalt is transformed to cobalt monosilicide where it overlies said gate electrodes and source and drain regions and wherein said cobalt overlying said dielectric spacers is unreacted;

removing said unreacted cobalt layer and said capping metal layer;

depositing a dielectric layer overlying said substrate and said cobalt monosilicide layer;

implanting silicon ions through said dielectric layer into said cobalt monosilicide layer;

thereafter subjecting said substrate to a second rapid thermal process whereby said cobalt monosilicide is transformed to cobalt disilicide wherein said silicon ions implanted into said cobalt monosilicide layer act as a silicon source for said transformation to complete formation of said cobalt disilicide film in the manufacture of said integrated circuit.

21. The method according to claim 20 wherein said cobalt layer is sputter deposited to a thickness of between about 50 and 200 Angstroms.

22. The method according to claim 20 wherein said capping metal layer comprises one of the group containing titanium and titanium nitride having a thickness of between about 100 and 300 Angstroms.

23. The method according to claim 20 wherein said dielectric layer comprises one of the group containing silicon oxide, silicon nitride, and silicon oxynitride and wherein said dielectric layer has a thickness of between about 500 and 1000 Angstroms.

24. The method according to claim 20 wherein said silicon ions are implanted at a dosage of between about $1 \times 10^{16}$ and $1 \times 10^{17}$ atoms/cm$^2$.

25. The method according to claim 20 wherein said second rapid thermal process is performed at a temperature of between about 750 and 900° C.

* * * * *